United States Patent
Affinito

(10) Patent No.: US 6,627,267 B2
(45) Date of Patent: *Sep. 30, 2003

(54) PLASMA ENHANCED CHEMICAL DEPOSITION WITH LOW VAPOR PRESSURE COMPOUNDS

(75) Inventor: John D. Affinito, Tucson, AZ (US)

(73) Assignee: Battelle Memorial Institute, Richland, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/853,906

(22) Filed: May 11, 2001

(65) Prior Publication Data

US 2001/0019747 A1 Sep. 6, 2001

Related U.S. Application Data

(63) Continuation-in-part of application No. 09/811,874, filed on Mar. 19, 2001, which is a continuation-in-part of application No. 08/939,594, filed on Sep. 29, 1997, now Pat. No. 6,224,948.

(51) Int. Cl.[7] ............................................. C23C 16/452
(52) U.S. Cl. ..................... 427/488; 427/497; 427/506; 427/507; 427/509; 427/520; 427/562; 427/569; 427/255.6
(58) Field of Search ................. 427/488, 497, 427/506, 507, 509, 520, 562, 569, 255.6

(56) References Cited

U.S. PATENT DOCUMENTS

| | | | |
|---|---|---|---|
| 3,475,307 A | * 10/1969 | Knox et al. | .................. 204/165 |
| 3,607,365 A | 9/1971 | Lindlof | |
| 4,098,965 A | 7/1978 | Kinsman | |
| 4,283,482 A | * 8/1981 | Hattori et al. | ................. 216/62 |

(List continued on next page.)

FOREIGN PATENT DOCUMENTS

| | | |
|---|---|---|
| BE | 704 297 | 2/1968 |
| DE | 19603746 | 4/1997 |
| EP | 0 299 753 | 1/1989 |
| EP | 0 340 935 | 11/1989 |
| EP | 0 390 540 | 10/1990 |
| EP | 0 547 550 | 6/1993 |
| EP | 0 590 467 | 4/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |

(List continued on next page.)

OTHER PUBLICATIONS

Affinito, J.D., et al., "Vacuum Deposition of Polymer Electrolytes on Flexible Substrates," "Proceedings of the Ninth International Conference on Vacuum Web Coating," Nov. 1995 ed R. Bakish, Bakish Press 1995, p. 20–36.

(List continued on next page.)

Primary Examiner—Timothy Meeks
(74) Attorney, Agent, or Firm—Killworth, Gottman, Hagan & Schaeff, L.L.P.

(57) ABSTRACT

A method for plasma enhanced chemical vapor deposition of low vapor pressure monomeric materials. The method includes making an evaporate by receiving a plurality of monomeric particles of the low vapor pressure monomeric materials as a spray into a flash evaporation housing, evaporating the spray on an evaporation surface, and discharging the evaporate through an evaporation outlet; making a monomer plasma from the evaporate by passing the evaporate proximate a glow discharge electrode; and cryocondensing the monomer plasma onto the substrate as a cryocondensed monomer. The invention also involves a method for making self-curing polymer layers in a vacuum chamber.

16 Claims, 3 Drawing Sheets

U.S. PATENT DOCUMENTS

| | | | |
|---|---|---|---|
| 4,581,337 A | 4/1986 | Frey et al. | |
| 4,624,867 A | 11/1986 | Iijima et al. | |
| 4,695,618 A | 9/1987 | Mowrer | |
| 4,842,893 A | 6/1989 | Yializis et al. | |
| 4,954,371 A * | 9/1990 | Yializis | 392/399 |
| 5,032,461 A | 7/1991 | Shaw et al. | |
| 5,204,314 A | 4/1993 | Kirlin et al. | |
| 5,237,439 A | 8/1993 | Misono et al. | |
| 5,260,095 A | 11/1993 | Affinito | |
| 5,354,497 A | 10/1994 | Fukuchi et al. | |
| 5,395,644 A | 3/1995 | Affinito | |
| 5,427,638 A | 6/1995 | Goetz et al. | |
| 5,440,446 A | 8/1995 | Shaw et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,607,789 A | 3/1997 | Treger et al. | |
| 5,620,524 A | 4/1997 | Fan et al. | |
| 5,629,389 A | 5/1997 | Roitman et al. | |
| 5,652,192 A | 7/1997 | Matson et al. | |
| 5,654,084 A | 8/1997 | Egert | |
| 5,665,280 A | 9/1997 | Tropsha | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,711,816 A | 1/1998 | Kirlin et al. | |
| 5,725,909 A | 3/1998 | Shaw et al. | |
| 5,731,661 A | 3/1998 | So et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,792,550 A | 8/1998 | Phillips et al. | |
| 5,811,177 A | 9/1998 | Shi et al. | |
| 5,811,183 A | 9/1998 | Shaw et al. | |
| 5,821,692 A | 10/1998 | Rogers et al. | |
| 5,844,363 A | 12/1998 | Gu et al. | |
| 5,872,355 A | 2/1999 | Hueschen | |
| 5,902,641 A | 5/1999 | Affinito et al. | |
| 5,902,688 A | 5/1999 | Antoniadis et al. | |
| 5,904,958 A | 5/1999 | Dick et al. | |
| 5,912,069 A | 6/1999 | Yializis et al. | |
| 5,919,328 A | 7/1999 | Tropsha et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,955,161 A | 9/1999 | Tropsha | |
| 5,965,907 A | 10/1999 | Huang et al. | |
| 5,968,620 A | 10/1999 | Harvey et al. | |
| 5,996,498 A | 12/1999 | Lewis | |
| 6,013,337 A | 1/2000 | Knors | |
| 6,045,864 A | 4/2000 | Lyons et al. | |
| 6,083,628 A | 7/2000 | Yializis | |
| 6,092,269 A | 7/2000 | Yializis et al. | |
| 6,106,627 A | 8/2000 | Yializis | |
| 6,146,225 A | 11/2000 | Sheats et al. | |
| 6,165,566 A | 12/2000 | Tropsha | |
| 6,207,239 B1 * | 3/2001 | Affinito | 427/255.6 |
| 6,214,422 B1 | 4/2001 | Yializis | |
| 6,224,948 B1 * | 5/2001 | Affinito | 427/255.6 |
| 6,231,939 B1 | 5/2001 | Shaw et al. | |

FOREIGN PATENT DOCUMENTS

| | | |
|---|---|---|
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Vossen, J.L., et al., Thin Film Processes, Academic Press, 1978, Part II, Chapter 11–1, Glow Discharge Sputter Deposition, p. 12–63; Part IV, Chapter IV–1, Plasma Deposition of Inorganic Compounds and Chapter IV–2 Glow Discharge Polymerization, p. 335–397.

Penning, F.M., Electrical Discharges in Gasses, Gordon and Breach Science Publishers, 1965, Chapters 5–6, p. 19–35, and Chapter 8, p. 41–50.

Affinito, J.D., et al, "High Rate Vacuum Deposition of Polymer Electrolytes," Journal Vacuum Science Technology A 14(3), May/Jun. 1996.

Inoue et al., Fabrication of a Thin Film of MNA by Vapour Deposition, Proc. Jpn. Congr. Mater. Res., vol. 33, p. 177–9, 1990.

Affinito, J.D., et al., "PML/Oxide/PML Barrier Layer Performance Differences Arising From Use of UV or Electron Beam Polymerization of the PML Layers," Thin Solid Films, Elsevier Science S.A., vol. 308–309, Oct. 31, 1997, pp. 19–25.

Gustafsson, G. et al, "Flexible light–emitting diodes made from soluble conducting polymers," Nature, vol. 357, Jun. 11, 1992, pp. 447–479.

Affinito, J.D. et al., "Polymer–Oxide Tranparent Barrier Layers," SVC 39th Annual Technical Conference, Vacuum Web Coating Session, 1996, pp. 392–397.

Affinito, J.D. et al, "PML/Oxide/PML Barrier Layer Performance Differences Arising From Use of UV or Electron Beam Polymerization of the PML Layers," SVC 40th Annual Technical Conference, 1997, pp. 19–25.

Wong, C.P., "Recent Advances in IC Passivation and Encapsulation: Process Techniques and Materials," Polymers for Electronic and Photonic Applications, AT&T Bell Laboratories, 1993, pp. 167–209.

De Gryse, R. et al., Sputtered Transparent Barrier Layers, pp. 190–198 (no date available).

Tropsha et al., "Activated Rate Theory Treatment of Oxygen and Water Transport through Silicon Oxide/Poly(ethylene terephthalate) Composite Barrier Structures," J. Phys. Chem B 1997, pp. 2259–2266.

Tropsha et al., "Combinatorial Barrier Effect of the Multilayer $SiO_x$ Coatings on Polymer Sustrates," 1997 Society of Vacuum Coaters, 40th Annual Technical Conference Proceedings.

Phillips et al., "Evaporated Dielectric Colorless Films on PET and OPP Exhibiting High Barriers Toward Moisture and Oxygen," Society of Vacuum Coaters, 36th Annual Technical Conference Proceedings (1993), pp. 293–300.

Chahroudi, Transparent Glass Barrier Coatings for Flexible Film Packaging, Society of Vacuum Coaters, 34th Annual Technical Conference Proceedings (1991), pp. 130–133.

Yamada et al., "The Properties of a New Transparent and Colorless Barrier Film," Society of Vacuum Coaters, 38th Annual Technical Conference Proceedings (1995), pp. 28–31.

Affinito, J.D. et al., "Molecularly Doped Polymer Composite Films for Light Emitting Polymer Applications Fabricated by the PML Process" 1998 Society of Vaccum Coaters, 41st Annual Technical Conference Proceedings (1998), pp. 220–225.

Mahon, J.K., et al., Requirements of Flexible Substrates for Organic Light Emitting Devices in Flat Panel Display Applications, Society of Vacuum Coaters, 42nd Annual Technical Conference Proceedings, Oct. 1999, pp. 456–459.

Shi, M.K., et al., Plasma treatment of PET and acrylic coating surfaces–I. In situ XPS measurements, Journal of Adhesion Science and Technology, Mar. 2000, 14(12), pp. 1–28.

Shi, M.K., et al., In situ and real–time monitoring of plasma–induced etching PET and acrylic films, Plasmas and Polymers, Dec. 1999, 4(4), pp. 1–25.

Affinito, J.D. et al., Vacuum Deposited Conductive Polymer Films, The Eleventh International Conference on Vacuum Web Coating, no earlier than Feb. 1998, pp. 200–213.

* cited by examiner

PLASMA ENHANCED CHEMICAL DEPOSITION WITH LOW VAPOR PRESSURE COMPOUNDS

CROSS REFERENCE TO RELATED APPLICATIONS

This application is a continuation-in-part of application Ser. No. 09/811,874, filed on Mar. 19, 2001, which is a continuation-in-part of application Ser. No. 08/939,594, filed on Sep. 29, 1997 (now U.S. Pat. No. 6,224,948 B1).

FIELD OF THE INVENTION

The present invention relates generally to a method of making plasma polymerized films. More specifically, the present invention relates to making a plasma polymerized film via plasma enhanced chemical deposition with a flash evaporated feed source of a low vapor pressure compound. As used herein, the term "(meth)acrylic" is defined as "acrylic or methacrylic". As used herein, the term "cryocondense" and forms thereof refers to the physical phenomenon of a phase change from a gas phase to a liquid phase upon the gas contacting a surface having a temperature lower than a dew point of the gas.

BACKGROUND OF THE INVENTION

The basic process of plasma enhanced chemical vapor deposition (PECVD) is described in THIN FILM PROCESSES, J. L. Vossen, W. Kern, editors, Academic Press, 1978, Part IV, Chapter IV—1 Plasma Deposition of Inorganic Compounds, Chapter IV—2 Glow Discharge Polymerization, herein incorporated by reference. Briefly, a glow discharge plasma is generated on an electrode that may be smooth or have pointed projections. Traditionally, a gas inlet introduces high vapor pressure monomeric gases into the plasma region wherein radicals are formed so that upon subsequent collisions with the substrate, some of the radicals in the monomers chemically bond or cross link (cure) on the substrate. The high vapor pressure monomeric gases include gases of $CH_4$, $SiH_4$, $C_2H_6$, $C_2H_2$, or gases generated from high vapor pressure liquid, for example styrene (10 torr at 87.4° F. (30.8° C.), hexane (100 torr at 60.4° F. (15.8° C.)), tetramethyldisiloxane (10 torr at 82.9° F. (28.3° C.) 1,3,-dichlorotetra-methyldisiloxane) and combinations thereof that may be evaporated with mild controlled heating. Because these high vapor pressure monomeric gases do not readily cryocondense at ambient or elevated temperatures, deposition rates are low (a few tenths of micrometer/min, maximum) relying on radicals chemically bonding to the surface of interest instead of cryocondensation. Remission due to etching of the surface of interest by the plasma competes with cryocondensation. Lower vapor pressure, species have not been used in PECVD because heating the higher molecular weight monomers to a temperature sufficient to vaporize them generally causes a reaction prior to vaporization, or metering of the gas becomes difficult to control, either of which is inoperative.

The basic process of flash evaporation is described in U.S. Pat. No. 4,954,371 herein incorporated by reference. This basic process may also be referred to as polymer multi-layer (PML) flash evaporation. Briefly, a radiation polymerizable and/or cross linkable material is supplied at a temperature below a decomposition temperature and polymerization temperature of the material. The material is atomized to droplets having a droplet size ranging from about 1 to about 50 microns. An ultrasonic atomizer is generally used. The droplets are then flash vaporized, under vacuum, by contact with a heated surface above the boiling point of the material, but below the temperature which would cause pyrolysis. The vapor is cryocondensed on a substrate then radiation polymerized or cross linked as a very thin polymer layer.

The material may include a base monomer or mixture thereof, cross-linking agents and/or initiating agents. A disadvantage of the flash evaporation is that it requires two sequential steps, cryocondensation followed by curing or cross linking, that are both spatially and temporally separate.

According to the state of the art of making plasma polymerized films, PECVD and flash evaporation or glow discharge plasma deposition and flash evaporation have not been used in combination. However, plasma treatment of a substrate using glow discharge plasma generator with inorganic compounds has been used in combination with flash evaporation under a low pressure (vacuum) atmosphere as reported in J. D. Affinito, M. E. Gross, C. A. Coronado, and P. M. Martin, "Vacuum Deposition Of Polymer Electrolytes On Flexible Substrates." Paper for Plenary talk in "Proceedings of the Ninth International Conference on Vacuum Web Coating", November 1995 ed R. Bakish, Bakish Press 1995, pg 20–36., and as shown in FIG. 1. In that system, the plasma generator 100 is used to etch the surface 102 of a moving substrate 104 in preparation to receive the monomeric gaseous output from the flash evaporation 106 that cryocondenses on the etched surface 102 and is then passed by a first curing station (not shown), for example electron beam or ultra-violet radiation, to initiate cross linking and curing. The plasma generator 100 has a housing 108 with a gas inlet 110. The gas may be oxygen, nitrogen, water or an inert gas, for example argon, or combinations thereof. Internally, an electrode 112 that is smooth or having one or more pointed projections 114 produces a glow discharge and makes a plasma with the gas which etches the surface 102. The flash evaporator 106 has a housing 116, with a monomer inlet 118 and an atomizing nozzle 120, for example an ultrasonic atomizer. Flow through the nozzle 120 is atomized into particles or droplets 122 which strike the heated surface 124 whereupon the particles or droplets 122 are flash evaporated into a gas that flows past a series of baffles 126 (optional) to an outlet 128 and cryocondenses on the surface 102. Although other gas flow distribution arrangements have been used, it has been found that the baffles 126 provide adequate gas flow distribution or uniformity while permitting ease of scaling up to large surfaces 102. A curing station (not shown) is located downstream of the flash evaporator 106.

Therefore, there is a need for an apparatus and method for making plasma polymerized layers at a fast rate but that is also self curing, avoiding the need for a curing station. Such an apparatus and method would be especially useful for making PML polymer layers.

SUMMARY OF THE INVENTION

The present invention may be viewed from two points of view, vis (1) an apparatus and method for plasma enhanced chemical vapor deposition of low vapor pressure monomeric materials onto a substrate, and (2) an apparatus and method for making self-curing polymer layers, especially self-curing PML polymer layers. From both points of view, the invention is a combination of flash evaporation with plasma enhanced chemical vapor deposition (PECVD) that provides the unexpected improvements of permitting use of low vapor pressure monomer materials in a PECVD process and provides a self curing from a flash evaporation process, at a rate surprisingly faster than standard PECVD deposition rates.

Generally, the apparatus of the present invention is (a) a flash evaporation housing with a monomer atomizer for making monomer particles, heated evaporation surface for making an evaporate from the monomer particles, and an evaporate outlet, (b) a glow discharge electrode downstream of the evaporate outlet for creating a glow discharge plasma from the evaporate, wherein (c) the substrate is proximate the glow discharge plasma for receiving and cryocondensing the glow discharge plasma thereon. All components are preferably within a low pressure (vacuum) chamber.

The method of the present invention has the steps of (a) flash evaporating a liquid monomer an evaporate outlet forming an evaporate;

(b) passing the evaporate to a glow discharge electrode creating a glow discharge monomer plasma from the evaporate; and (c) cryocondensing the glow discharge monomer plasma on a substrate and crosslinking the glow discharge plasma thereon, wherein the crosslinking results from radicals created in the glow discharge plasma and achieves self curing.

It is an object of the present invention to provide an apparatus and method combining flash evaporation with glow discharge plasma deposition.

It is an object of the present invention to provide an apparatus and method of making a self curing polymer layer.

It is another object of the present invention to provide an apparatus and method of making a self curing PML polymer layer.

It is another object of the present invention to provide an apparatus and method of PECVD deposition of low vapor pressure monomer.

An advantage of the present invention is that it is insensitive to a direction of motion of the substrate because the deposited monomer layer is self curing. In the prior art, the deposited monomer layer required a radiation curing apparatus so that the motion of the substrate had to be from the place of deposition toward the radiation apparatus. Another advantage of the present invention is that multiple layers of materials may be combined. For example, as recited in U.S. Pat. Nos. 5,547,508 and 5,395,644, 5,260,095, hereby incorporated by reference, multiple polymer layers, alternating layers of polymer and metal, and other layers may be made with the present invention in the vacuum environment.

The subject matter of the present invention is particularly pointed out and distinctly claimed in the concluding portion of this specification. However, both the organization and method of operation, together with further advantages and objects thereof, may best be understood by reference to the following detailed description in combination with the drawings wherein like reference characters refer to like elements.

DESCRIPTION OF THE PREFERRED EMBODIMENT(S)

Figure 1:
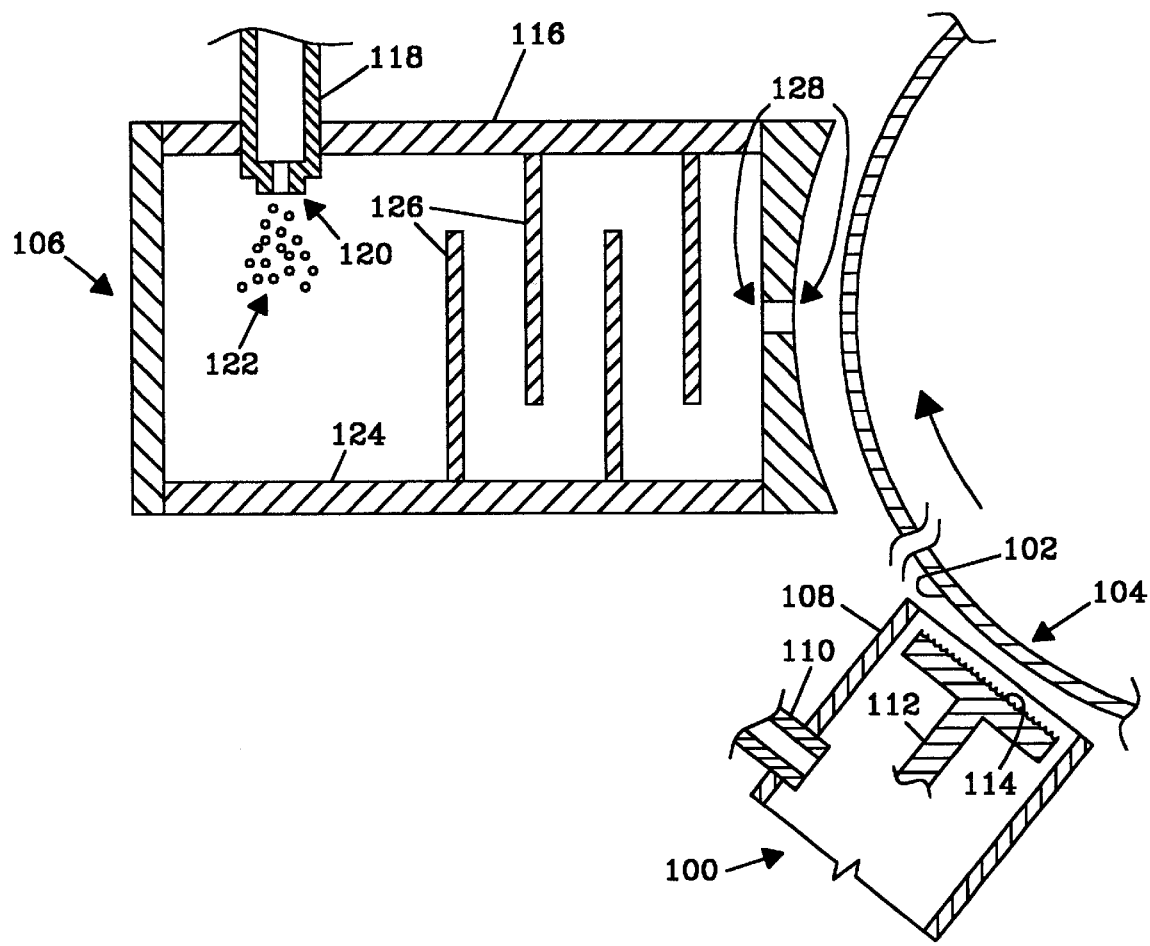
FIG. 1 is a cross section of a prior art combination of a glow discharge plasma generator with inorganic compounds with flash evaporation.
Figure 2:
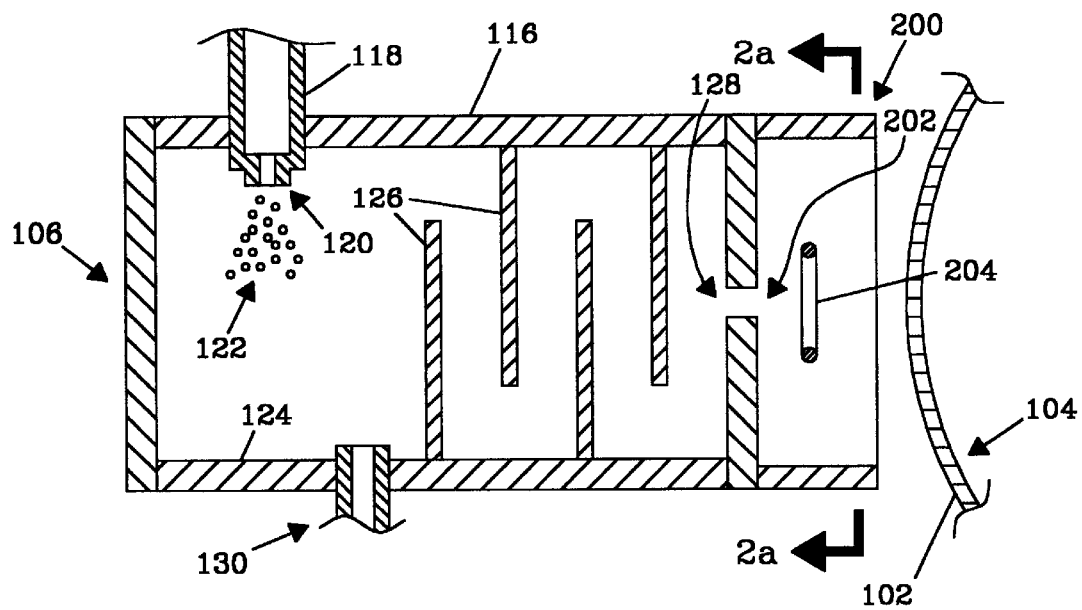
FIG. 2 is a cross section of the apparatus of the present invention of combined flash evaporation and glow discharge plasma deposition.

According to the present invention, the apparatus is shown in FIG. 2. The apparatus and method of the present invention are preferably within a low pressure (vacuum) environment or chamber. Pressures preferably range from about $10^{-1}$ torr to $10^{-6}$ torr. The flash evaporator 106 has a housing 116, with a monomer inlet 118 and an atomizing nozzle 120. Flow through the nozzle 120 is atomized into particles or droplets 122 which strike the heated surface 124 whereupon the particles or droplets 122 are flash evaporated into a gas or evaporate that flows past a series of baffles 126 to an evaporate outlet 128 and cryocondenses on the surface 102. Cryocondensation on the baffles 126 and other internal surfaces is prevented by heating the baffles 126 and other surfaces to a temperature in excess of a cryocondensation temperature or dew point of the evaporate. Although other gas flow distribution arrangements have been used, it has been found that the baffles 126 provide adequate gas flow distribution or uniformity while permitting ease of scaling up to large surfaces 102. The evaporate outlet 128 directs gas toward a glow discharge electrode 204 creating a glow discharge plasma from the evaporate. In the embodiment shown in FIG. 2, the glow discharge electrode 204 is placed in a glow discharge housing 200 having an evaporate inlet 202 proximate, the evaporate outlet 128. In this embodiment, the glow discharge housing 200 and the glow discharge electrode 204 are maintained at a temperature above a dew point of the evaporate. The glow discharge plasma exits the glow discharge housing 200 and cryocondenses on the surface 102 of the substrate 104. It is preferred that the substrate 104 is kept at a temperature below a dew point of the evaporate, preferably ambient temperature or cooled below ambient temperature to enhance the cryocondensation rate. In this embodiment, the substrate 104 is moving and may be non-electrically conductive, electrically conductive, or electrically biased with an impressed voltage to draw charged species from the glow discharge plasma. If the substrate 104 is electrically biased, it may even replace the electrode 204 and be, itself, the electrode which creates the glow discharge plasma from the monomer gas. Substantially not electrically biased means that there is no impressed voltage although a charge may build up due to static electricity or due to interaction with the plasma.

Figure 2A:
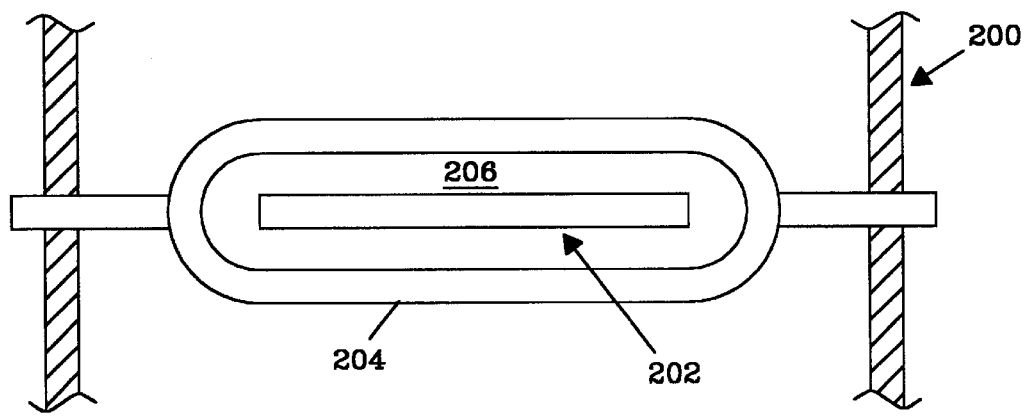
FIG. 2a is a cross section end view of the apparatus of the present invention.

A preferred shape of the glow discharge electrode 204, is shown in FIG. 2a. In this preferred embodiment, the glow discharge electrode 204 is separate from the substrate 104 and shaped so that evaporate flow from the evaporate inlet 202 substantially flows through an electrode opening 206. Any electrode shape can be used to create the glow discharge, however, the preferred shape of the electrode 204 does not shadow the plasma from the evaporate issuing from the outlet 202 and its symmetry, relative to the monomer exit slit 202 and substrate 104, provides uniformity of the evaporate vapor flow to the plasma across the width of the substrate while uniformity transverse to the width follows from the substrate motion.

The spacing of the electrode 204 from the substrate 104 is a gap or distance that permits the plasma to impinge upon the substrate. This distance that the plasma extends from the electrode will depend on the evaporate species, electrode 204/substrate 104 geometry, electrical voltage and frequency, and pressure in the standard way as described in detail in ELECTRICAL DISCHARGES IN GASSES, F. M. Penning, Gordon and Breach Science Publishers, 1965, and summarized in THIN FILM PROCESSES, J. L. Vossen, W.

Kern, editors, Academic Press, 1978, Part II, Chapter II-1, Glow Discharge Sputter Deposition, both hereby incorporated by reference.

Figure 3:
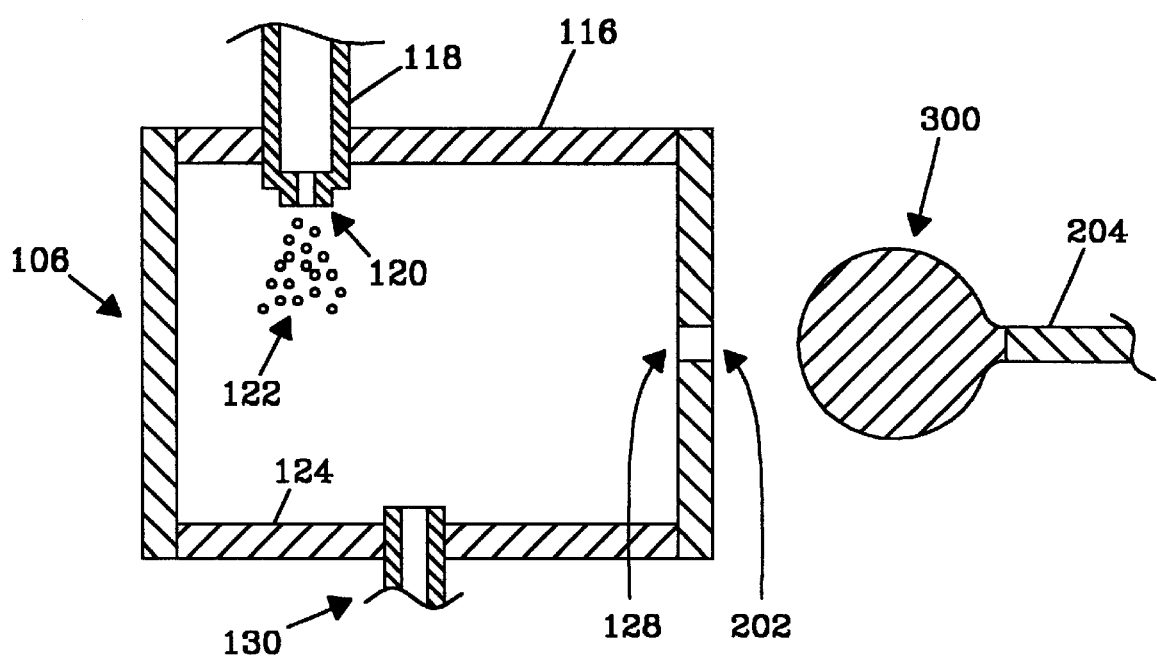
FIG. 3 is a cross section of the present invention wherein the substrate is the electrode.

An apparatus suitable for batch operation is shown in FIG. 3. In this embodiment, the glow discharge electrode 204 is sufficiently proximate a part 300 (substrate) that the part 300 is an extension of or part of the electrode 204. Moreover, the part is below a dew point to allow cryocondensation of the glow discharge plasma on the part 300 and thereby coat the part 300 with the monomer condensate and self cure into a polymer layer. Sufficiently proximate may be connected to, resting upon, in direct contact with, or separated by a gap or distance that permits the plasma to impinge upon the substrate. This distance that the plasma extends from the electrode will depend on the evaporate species, electrode 204/substrate 104 geometry, electrical voltage and frequency, and pressure in the standard way as described in ELECTRICAL DISCHARGES IN GASSES, F. M. Penning, Gordon and Breach Science Publishers, 1965, hereby incorporated by reference. The substrate 300 may be stationary or moving during cryocondensation. Moving includes rotation and translation and may be employed for controlling the thickness and uniformity of the monomer layer cryocondensed thereon. Because the cryocondensation occurs rapidly, within milli-seconds to seconds, the part may be removed after coating and before it exceeds a coating temperature limit.

In operation, either as a method for plasma enhanced chemical vapor deposition of low vapor pressure monomeric materials onto a substrate, or as a method for making self-curing polymer layers (especially PML), the method of the invention has the steps of (a) flash evaporating a liquid monomer an evaporate outlet forming an evaporate; (b) passing the evaporate to a glow discharge electrode creating a glow discharge monomer plasma from the evaporate; and (c) cryocondensing the glow discharge monomer plasma on a substrate and crosslinking the glow discharge plasma thereon. The crosslinking results from radicals created in the glow discharge plasma thereby permitting self curing.

The flash evaporating has the steps of flowing a monomer liquid to an inlet, atomizing the monomer liquid through a nozzle and creating a plurality of monomer particles of the monomer liquid as a spray. The spray is directed onto a heated evaporation surface whereupon it is evaporated and discharged through an evaporate outlet.

The liquid monomer may be any liquid monomer. However, it is preferred that the monomer material or liquid have a low vapor pressure at ambient temperatures so that it will readily cryocondense. Preferably, the vapor pressure of the monomer material is less than about 10 torr at 83° F. (28.3° C.), more preferably less than about 1 torr at 83° F. (28.3° C.), and most preferably less than about 10 millitorr at 83° F. (28.3° C.). For monomers of the same chemical family, monomers with low vapor pressures usually also have higher molecular weight and are more readily cryocondensible than higher vapor pressure, lower molecular weight monomers. Liquid monomer includes but is not limited to acrylic monomers, for example tripropyleneglycol diacrylate, tetraethylene glycol diacrylate, tripropylene glycol monoacrylate, caprolactone acrylate, and combinations thereof; methacrylic monomers; and combinations thereof. The (meth)acrylic monomers are particularly useful in making molecularly doped polymers (MDP), light emitting polymers (LEP), and light emitting electrochemical cells (LEC).

By using flash evaporation, the monomer is vaporized so quickly that reactions that generally occur from heating a liquid monomer to an evaporation temperature simply do not occur. Further, control of the rate of evaporate delivery is strictly controlled by the rate of liquid monomer delivery to the inlet 118 of the flash evaporator 106.

In addition to the evaporate from the liquid monomer, additional gases may be added within the flash evaporator 106 through a gas inlet 130 upstream of the evaporate outlet 128, preferably between the heated surface 124 and the first baffle 126 nearest the heated surface 124. Additional gases may be organic or inorganic for purposes included but not limited to ballast, reaction and combinations thereof. Ballast refers to providing sufficient molecules to keep the plasma lit in circumstances of low evaporate flow rate. Reaction refers to chemical reaction to form a compound different from the evaporate. Ballast gases include but are not limited to group VIII of the periodic table, hydrogen, oxygen, nitrogen, chlorine, bromine, polyatomic gases including for example carbon dioxide, carbon monoxide, water vapor, and combinations thereof. An exemplary reaction is by addition of oxygen gas to the monomer evaporate hexamethylydisiloxane to obtain silicon dioxide.

EXAMPLE 1

An experiment was conducted to demonstrate the present invention as shown in FIG. 2 and described above. Tetraethyleneglycoldiacrylate was used as the liquid monomer. The heated surface was set at a temperature of about 650° F. (343° C.). Liquid monomer was introduced to the inlet via a capillary with 0.032 inch I.D. The ultrasonic atomizer had a tip with 0.051 inch I.D. Rate of deposition of the polymer layer was 0.5 m/min for 25 micron thick polymer layer and 100 m/min for 1 micron thick polymer layer. Visual inspection of the cured polymer layer did not reveal any pin holes or other flaw.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for plasma enhanced chemical vapor deposition of low vapor pressure monomeric materials onto a substrate in a vacuum environment, comprising:
   (a) making an evaporate by receiving a plurality of monomer particles of the low vapor pressure monomeric materials as a spray into a flash evaporation housing, evaporating said spray into a flash evaporation housing, evaporating said spray on an evaporation surface, and discharging said evaporate through an evaporation outlet;
   (b) making a monomer plasma from said evaporate by passing said evaporate proximate a glow discharge electrode; and
   (c) cryocondensing said monomer plasma onto said substrate as a cryocondensed monomer.

2. The method as recited in claim 1, said substrate is proximate the glow discharge electrode, is electrically biased with an impressed voltage, and receives the monomer plasma cryocondensing thereon.

3. The method as recited in claim 1, wherein said monomer is selected from the group consisting of acrylic monomer, methacrylic monomer and combinations thereof.

4. The method as recited in claim 3, wherein said acrylic monomer is selected from the group consisting of tripropyleneglycol diacrylate, tetraethylene glycol diacrylate, tripropylene glycol monoacrylate, caprolactone acrylate, and combinations thereof.

5. The method as recited in claim 1, wherein said substrate is cooled.

6. The method as recited in claim 1, further comprising adding an additional gas upstream of said evaporate outlet.

7. The method as recited in claim 6, wherein said additional gas is a ballast gas.

8. The method of claim 1 further comprising crosslinking said cryocondensed monomer on said substrate without a separate curing step.

9. The method of claim 1 wherein a layer of said cryocondensed monomer is up to 25 microns in thickness.

10. A method for making self-curing polymer layers in a vacuum chamber, comprising:
    (a) flash evaporating a low vapor pressure liquid monomer into an evaporate;
    (b) passing said evaporate to a glow discharge electrode creating a glow discharge monomer plasma from said evaporate; and
    (c) cryocondensing said glow discharge monomer plasma on a substrate as a cryocondensed monomer and crosslinking said cryocondensed monomer thereon, said crosslinking resulting from radicals created in said glow discharge plasma.

11. The method of claim 10, wherein the substrate is proximate the glow discharge electrode, is electrically biased with an impressed voltage, and receives the monomer plasma cryocondensing thereon.

12. The method as recited in claim 10, wherein said monomer is selected from the group consisting of acrylic monomer, methacrylic monomer and combinations thereof.

13. The method as recited in claim 12, wherein said acrylic monomer is selected from the group consisting of tripropyleneglycol diacrylate, tetraethylene glycol diacrylate, tripropylene glycol monoacrylate, caprolactone acrylate, and combinations thereof.

14. The method as recited in claim 10, wherein said substrate is cooled.

15. The method as recited in claim 10, wherein said low vapor pressure is less than about 10 torr at 83° F. (28.3° C.).

16. The method of claim 10, wherein a layer of said cryocondensed monomer is up to 25 microns in thickness.

* * * * *

UNITED STATES PATENT AND TRADEMARK OFFICE
CERTIFICATE OF CORRECTION

PATENT NO. : 6,627,267 B2
DATED : September 30, 2003
INVENTOR(S) : John D. Affinito It is certified that error appears in the above-identified patent and that said Letters Patent is hereby corrected as shown below:

Column 1,
Line 48, "(a few tenths of micrometer/min, maximum)" should read -- (a few tenths of micrometer/min maximum) --

Column 4,
Line 27, "inlet 202 proximate, the evaporate" should read -- inlet 202 proximate the evaporate --

Column 6,
Line 61, "in claim 1, said substrate is" should read -- in claim 1, wherein said substrate --

Signed and Sealed this

Thirteenth Day of July, 2004

JON W. DUDAS
*Acting Director of the United States Patent and Trademark Office*